United States Patent
Yu et al.

(10) Patent No.: US 9,661,790 B2
(45) Date of Patent: May 23, 2017

(54) BACKPLANE WITH ADJUSTABLE CURVATURE AND APPLICATION THEREOF

(71) Applicant: Shenzhen China Star Optoelectronics Technology Co., Ltd., Shenzhen, Guangdong (CN)

(72) Inventors: Yajun Yu, Guangdong (CN); Chengling Lv, Guangdong (CN); Guofu Tang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 497 days.

(21) Appl. No.: 14/372,001

(22) PCT Filed: Jul. 2, 2014

(86) PCT No.: PCT/CN2014/081444
§ 371 (c)(1),
(2) Date: Jul. 11, 2014

(87) PCT Pub. No.: WO2015/192400
PCT Pub. Date: Dec. 23, 2015

(65) Prior Publication Data
US 2016/0278246 A1    Sep. 22, 2016

(30) Foreign Application Priority Data
Jun. 17, 2014    (CN) .......................... 2014 1 0271392

(51) Int. Cl.
*H05K 7/20*    (2006.01)
*H05K 5/02*    (2006.01)
(Continued)

(52) U.S. Cl.
CPC ... *H05K 7/20954* (2013.01); *G02F 1/133305* (2013.01); *G02F 1/133308* (2013.01);
(Continued)

(58) Field of Classification Search
CPC ... H01L 2251/5338; H01L 2224/48091; H01L 51/0097; G02F 1/133305; G02F 1/133308;
(Continued)

(56) References Cited

U.S. PATENT DOCUMENTS

| 4,383,004 A * | 5/1983 | Spengler | ................. | G01K 5/66 148/529 |
| 6,593,010 B2 * | 7/2003 | Izbicki | ................. | B32B 15/01 428/659 |

(Continued)

FOREIGN PATENT DOCUMENTS

| CN | 202057923 U | 11/2011 |
| CN | 103093699 A | 5/2013 |

*Primary Examiner* — Adam B Dravininkas
(74) *Attorney, Agent, or Firm* — Andrew C. Cheng

(57) ABSTRACT

The invention provides a backplane with adjustable curvature and its application. The backplane includes an active layer and a passive layer connected with the active layer. The active layer is formed by a material with a first thermal expansion coefficient, and the passive layer is formed by a material with a second thermal expansion coefficient. The first thermal expansion coefficient is greater than the second thermal expansion coefficient. It further includes a temperature sensor set on the backplane and a temperature controller electrically coupled to the backplane to adjust the backplane temperature. A fast and continuous adjustment to the curvature of the backplane can be achieved by controlling the temperature of the backplane.

8 Claims, 5 Drawing Sheets

(51) Int. Cl.
*G02F 1/1333* (2006.01)
*H01L 51/00* (2006.01)

(52) U.S. Cl.
CPC ....... *H01L 51/0097* (2013.01); *H05K 5/0217* (2013.01); *H05K 5/0247* (2013.01); *G02F 2001/133314* (2013.01); *G02F 2001/133322* (2013.01); *H01L 2251/5338* (2013.01)

(58) Field of Classification Search
CPC ........... G02F 2202/28; G02F 1/133382; G02F 2001/133314; G02F 2001/13332; G02F 1/33308; H05K 1/0393; H05K 1/189; H05K 1/147; H05K 1/14; H05K 7/20954; H05K 5/0217; H05K 5/0247
See application file for complete search history.

(56) References Cited

U.S. PATENT DOCUMENTS

| | | | |
|---|---|---|---|
| 9,383,600 B2* | 7/2016 | Lv | G02F 1/133382 |
| 2009/0169918 A1* | 7/2009 | Haynes | B32B 15/013 |
| | | | 428/656 |
| 2012/0281367 A1* | 11/2012 | He | H05K 5/02 |
| | | | 361/728 |
| 2013/0002572 A1* | 1/2013 | Jin | G02F 1/133305 |
| | | | 345/173 |
| 2013/0114193 A1* | 5/2013 | Joo | F16M 11/08 |
| | | | 361/679.01 |
| 2013/0329162 A1* | 12/2013 | Fujii | H05K 7/14 |
| | | | 349/58 |
| 2014/0118910 A1* | 5/2014 | Sung | G09F 9/301 |
| | | | 361/679.01 |
| 2014/0247566 A1* | 9/2014 | Lee | H05K 5/03 |
| | | | 361/749 |
| 2014/0254111 A1* | 9/2014 | Yamazaki | H01L 51/0097 |
| | | | 361/749 |
| 2014/0340856 A1* | 11/2014 | Yeo | H05K 1/0281 |
| | | | 361/749 |
| 2014/0346946 A1* | 11/2014 | An | H05B 33/22 |
| | | | 313/511 |
| 2015/0035812 A1* | 2/2015 | Shin | G09G 3/3688 |
| | | | 345/204 |
| 2015/0092353 A1* | 4/2015 | Baik | H05K 1/028 |
| | | | 361/720 |
| 2015/0296641 A1* | 10/2015 | Song | H05K 5/0217 |
| | | | 361/679.01 |

* cited by examiner

BACKPLANE WITH ADJUSTABLE CURVATURE AND APPLICATION THEREOF

BACKGROUND OF THE INVENTION

Field of the Invention

This invention relates to display technology, and more particularly, to a backplane with adjustable curvature and its application.

Description of Related Art

A Liquid crystal display (LCD) and an organic light-Emitting diode-based apparatus are two well-developed display technology items.

The LCD possesses advantages of slim dimensions, low electronic power consumption, low radiation . . . etc. and is with a lot of applications, for example, LCD TV, personal PDA, a digital camera, a display of a computer or a laptop and so on.

Generally the LCD comprises a housing, a liquid crystal panel and a backlight module inside the housing. The working mechanism of the LCD is to control the alignment orientation of liquid crystal between two parallel glass substrates and yield pixels through the light refracted from the backlight module via the change of an electronic field induced by the vertical and horizontal electronic circuits between the glass substrates. The backlight module can be classified as a side-in or a direct-in module. A direct-in backlight module is to utilize a backlight source like fluorescent lamps or light emitting diodes (LEDs) on the backside of the LCD panel, and the plane light can be uniformly formed via a diffuser plate for providing light source for the LCD panel. A side-in backlight module is to form plane light for the LCD panel via the light generated by a LED light bar set on the edge of the backplane behind the LCD panel, entering to one side of a light guide plate, then reflected and diffused from the light guide plate (LGP), finally passing through optical film module.

The organic light emitting diode (OLED) display is different from the LCD display, and it is not necessary for backlight due to its self-lighting function. Very thin organic coating and corresponding glass substrate are adopted for the OLED. The organic material emits light with electric power, and display function can be attained.

Recently, many manufacturers promote the curved TV and display with evolution of display technology. Overall, the curved display can provide an optimized viewing quality from the center to edge of display, while the traditional LCD has difficulty to obtain a better viewing quality near the edge side. The design of the curved display can provide an arc shape and broad viewing image. Very similar image quality can be acquired whatever on center of sides of display. Meanwhile, the off-axis image distortion can be enhanced as viewing from a short distance. Moreover, the user's viewing distance can be increased, and a better viewing experience can be acquired for the curved display. Therefore, the curved display has a huge advantage with respect to the traditional LCD due to: 1. differentiation of product, 2. broad viewing angle, and 3. decrease of the image distortion from near view.

The current curved display can be manufactured by using two approaches majorly: 1. attaching the backplane of the LCD to the frame with specific curvature and enforcing the backplane to be with the same curvature of the frame; 2. directly forming curved structure on the backplane. However, both methods can only adopt rigid curvature, so the curvature of the display is rigid and cannot be adjusted based on user's demand. The viewing angle is limited as well.

SUMMARY OF THE INVENTION

An object of the present invention is to provide a backplane with adjustable curvature, to achieve a fast and continuous adjustment to the curvature of the backplane.

Another object of the present invention is to provide an application of the backplane with the adjustable curvature. The curvature can be adjusted by the application of the backplane, to achieve an easy, rapid and continuous adjustment to the curvature of the display device, allow users to get different display status depending on the needs in watching, and improve the attractiveness of the market. Moreover, the structure of the invention is relatively simple and easy to be implemented.

To achieve the above objects, the present invention proposes a backplane with adjustable curvature, including an active layer and a passive layer connected to the active layer, the active layer is made of a material with a first thermal expansion coefficient, and the passive layer is made of a material with a second thermal expansion coefficient. The first thermal expansion coefficient is greater than the second coefficient of thermal expansion.

The first thermal expansion coefficient is in a range of $(20\sim27)\times10^{-6}$ m/° C. in 20-100° C., and the second thermal expansion coefficient is in a range of $(1.8\sim4.8)\times10^{-6}$ m/° C. in 20-100° C.

The specific thermal deflection between the material with the first thermal expansion coefficient and the material with the second thermal expansion coefficient is in a range of $(10\sim20)\times10{-6}$ K-1.

The resistivity of the material of the active layer and the resistivity of the material of the passive layer are in a range of $(2\sim11)\times10{-6}$ Ω·m.

The passive layer and the active layer are formed by metal materials.

The active layer and the passive layer are formed by a thermal bimetal. The material of the active layer is brass, nickel, or an alloy of Fe—Ni—Cr, Fe—Ni—Mn or Mn—Ni—Cu, and the material of the passive layer containing 34%~50% Ni is Invar alloy.

The backplane with the adjustable curvature also includes a temperature sensor located on the backplane in order to detect and display real-time temperature of the backplane.

The backplane with adjustable curvature further includes a temperature controller electrically connected the backplane to regulate the temperature of the backplane.

The temperature sensor is electrically connected to the temperature controller in order to provide real-time temperature data for the temperature controller and achieve the automatic temperature control.

The present invention also provides a backplane with adjustable curvature, including the active layer and the passive layer connected to the active layer. The active layer is made of a material with the first thermal expansion coefficient, and the passive layer is made of a material with the second thermal expansion coefficient. The first thermal expansion coefficient is greater than the second thermal expansion coefficient.

The first thermal expansion coefficient is in a range of $(20\sim27)\times10^{-6}$ m/° C. in 20-100° C., and the second thermal expansion coefficient is in a range of $(1.8\sim4.8)\times10^{-6}$ m/° C. in 20-100° C.

The specific thermal deflection between the material with the first thermal expansion coefficient and the material with the second thermal expansion coefficient is in a range of $(10\sim20)\times10^{-6}K^{-1}$.

The resistivity of the material of the active layer and the resistivity of the material of the passive layer are in a range of $(2\sim11)\times10\text{-}6$ Ω·m.

The passive layer and the active layer are formed by metal materials.

The active layer and the passive layer are formed by a thermal bimetal. The material of the active material layer is brass, nickel, or an alloy of Fe—Ni—Cr, Fe—Ni—Mn or Mn—Ni—Cu, and the material of the passive layer Ni is an Invar alloy containing 34%~50%.

The backplane with the adjustable curvature also includes a temperature sensor located on the backplane in order to detect and display the real-time temperature of the backplane.

The backplane with the adjustable curvature further comprises a temperature controller electrically connected to the backplane in order to regulate the temperature of the backplane.

The temperature sensor is electrically connected to the temperature controller, providing real-time temperature data for the temperature controller in order to achieve automatic temperature control.

The present invention also provides an application of the backplane with the adjustable curvature. It can be adopted by a liquid crystal display or organic light emitting diode display device.

The advantages of this invention:

For the backplane with the adjustable curvature, the first thermal expansion coefficient of the material of the active layer is greater than the second thermal expansion coefficient of the material of the passive layer. As the backplane is heated electronically, the deformation of the active layer is larger than that of the passive layer due to thermal expansion, so the backplane is bent toward the side of the passive layer. Meanwhile, the temperature of the backplane can be detected and displayed via the temperature sensor, then it can be controlled via the temperature controller. Therefore, the curvature of the backplane can be fast and continuously adjusted by controlling the temperature of the backplane. The backplane with the adjustable curvature can be used in a liquid crystal display device or an organic light emitting diode display device by adjusting the curvature of the backplane to easily, quickly, continuously adjust the curvature of the display device. Users can attain different display status based on different needs in watching so as to promote the attractiveness to the market, and the structure of the invention is relatively simple and easy to be implemented.

To better understand the characteristics and technical aspects of the invention, please refer to the following detailed description of the present invention with figures, the accompanying drawings and the description provided by only with reference to, but not intended to limit the present invention.

BRIEF DESCRIPTION OF THE DRAWINGS

Below in conjunction with the accompanying drawings, the present invention is described in detail via specific embodiments and the advantages of present invention and corresponding technology are obvious from them.

In attached drawings.

DESCRIPTION OF THE EMBODIMENTS

Figure 1:
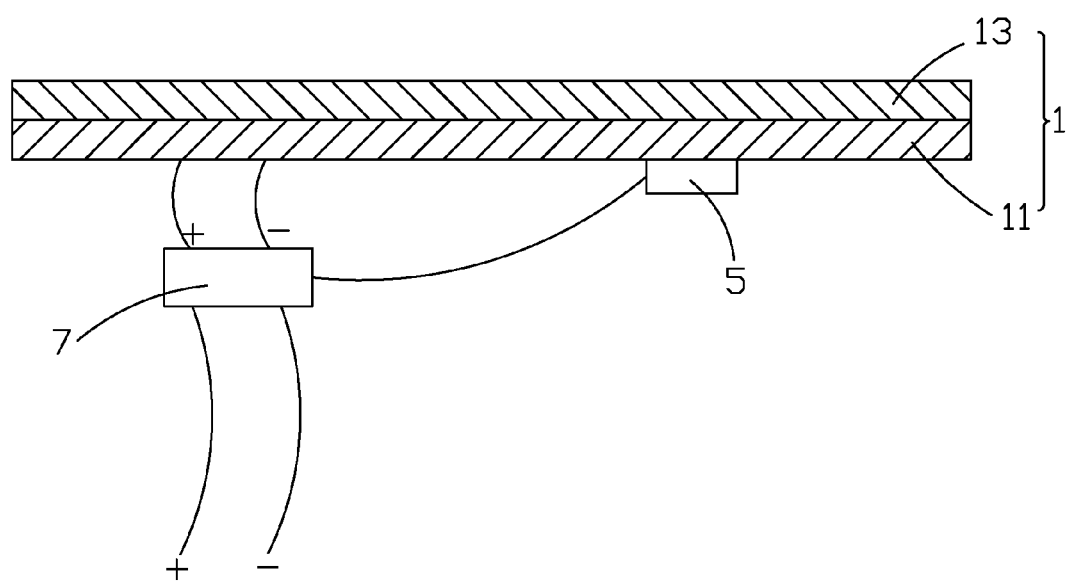
FIG. 1 is a cross-section of the backplane with adjustable curvature under the status without bending.

To further illustrate the present invention and the technical means adopted by the effect of the following in connection with preferred embodiments of the present invention, the detailed description and the accompanying drawings.

The present invention provides a backplane 1 with adjustable curvature, including the active layer 11 and the passive layer 13 which is connected to the active layer. The active layer 11 is made of a material with a first thermal expansion coefficient, and the passive layer 13 is made of a material with a second thermal expansion coefficient, as illustrated from FIG. 1 to FIG. 3.

The first thermal expansion coefficient is greater than the second thermal expansion coefficient, and a large difference is between the first and second thermal expansion coefficient. Therefore, the strain of active layer 11 due to thermal expansion is significantly greater than that of passive layer 13 as the backplane 1 is heated, so bending deformation is toward the passive layer 13.

The active layer 11 can be set below the passive layer 13 and this arrangement results the bending deformation toward the higher side of the passive layer and shows a convex shape. Alternatively, the active layer 11 can be set above the passive layer 13 and this arrangement results the bending deformation toward the lower side of the passive layer and shows a concave shape. Therefore, the position of active and passive layers can be decided based on the bending direction of the backplane in application.

Furthermore, the first thermal expansion coefficient is in the range of $(20\sim27)\times10^{-6}$ m/° C. in 20-100° C.; the second thermal expansion coefficient is in the range of $(1.8\sim4.8)\times10^{-6}$ m/° C. in 20-100° C.; the first thermal expansion coefficient is much larger than the second one. The specific thermal deflection between the material with the first thermal expansion coefficient and the material with the second thermal expansion coefficient is in the range of $(10\sim20)\times10^{-6}$ $K^{-1}$.

Higher electrical resistance is needed for the material constituting the active layer 11 and the passive layer 13 to produce sufficient amount of heat as electrical power in on, causing thermal expansion of active layer 11 and passive layer 13. Specifically, the resistivity of the active layer 11 and the resistivity of the passive layer 13 is in the range of $(2\sim11)\times10^{-6}$ Ω·m.

To meet the requirements of larger difference between the first and second thermal expansion coefficients and higher resistivity for the active layer 11 and the passive layer 13, the active layer 11 and the passive layer 13 are formed by metal materials. Furthermore, the active layer 11 and the passive layer 13 are formed by a thermal bimetal, the active material layer 11 can be brass, nickel, or an alloy of Fe—Ni—Cr, Fe—Ni—Mn or Mn—Ni—Cu, and the material of the passive layer 13 is an Invar alloy containing 34%~50% Ni.

The backplane 1 with the adjustable curvature further comprises a temperature sensor 5, and a temperature controller 7 electrically connected to the backplane. The temperature sensor 5 is closely attached to the backplane 1 and is used to detect and display the real-time temperature of the backplane 1. As temperature controller 7 is electrically connected to the backplane 1 and a power supply (not shown), the function of the temperature controller 7 is to control the magnitude of the voltage and the current for adjusting the temperature of the backplane 1. It is worth to mention that the temperature sensor 5 is electrically coupled to the temperature controller 7 in order to provide real-time temperature data for the temperature controller 7, so the automatic temperature control can be achieved.

Please refer to FIG. 1, the backplane is shown as a planar and in an undeforming status under no electrical power. The backplane can be used as a planar backplane for this situation.

Figure 2:
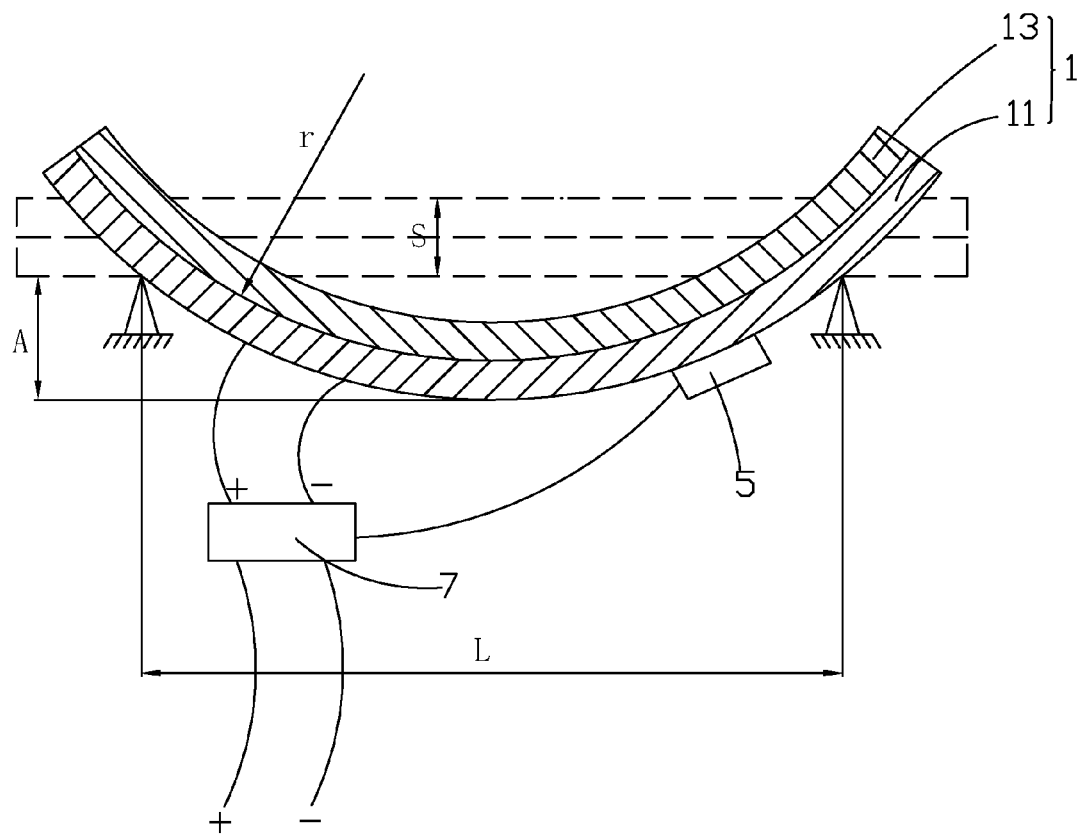
FIG. 2 is a cross-section of the backplane with adjustable curvature under the status with bending.
Figure 3:
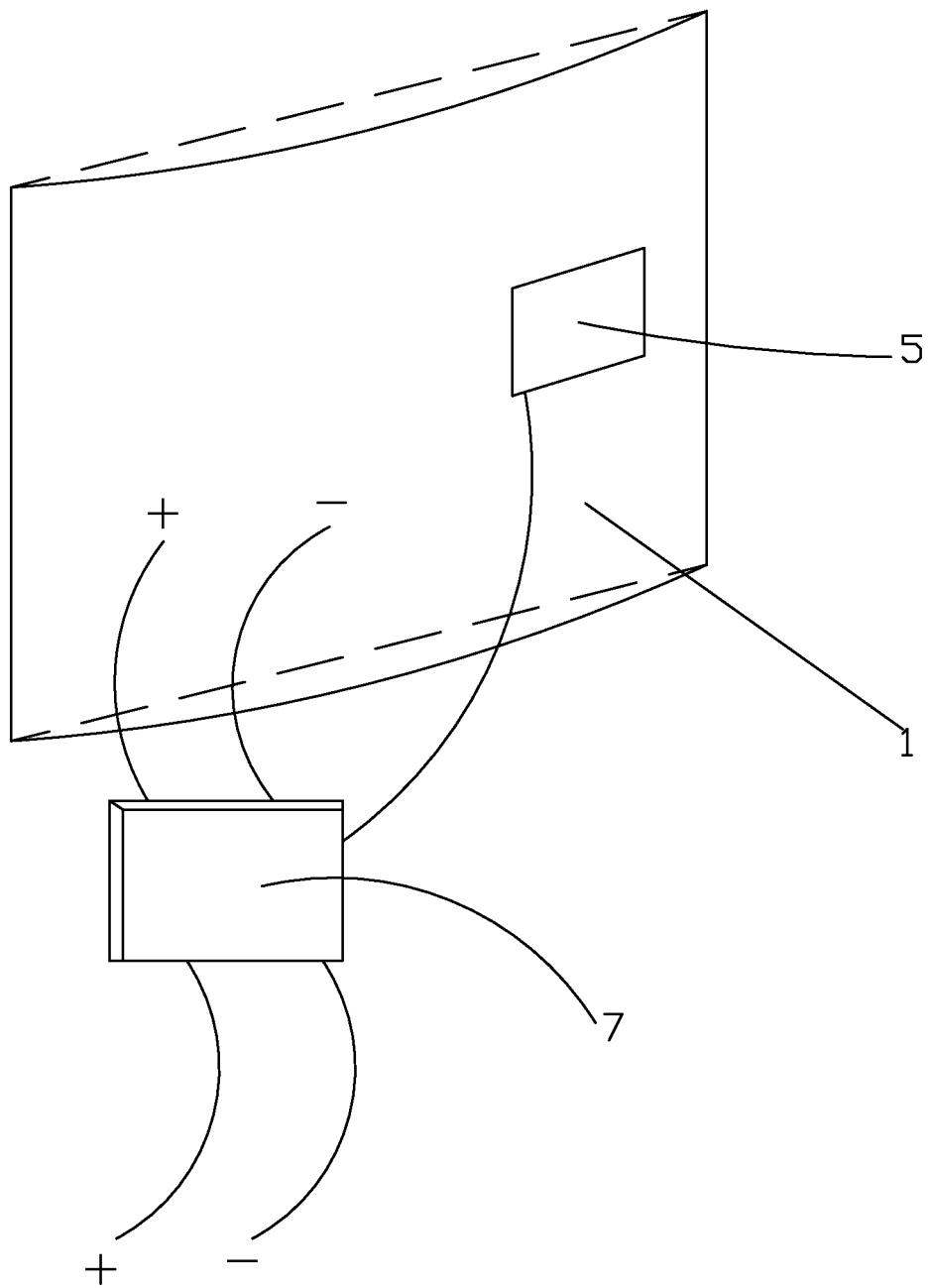
FIG. 3 is a schematic perspective view of the backplane with adjustable curvature, dash line shows a status without bending and solid line shows a status with bending.

Please refer to FIG. 2, as turning on the electrical power to the backplane directly, since the material of the active layer 11 and the material of the passive layer 13 in the backplane have higher internal resistance, the active layer 11 and the passive layer 13 rapidly generate a lot of heat and result the rise of temperature. Meanwhile, the first thermal expansion coefficient of the active layer 11 is greater than the second thermal expansion coefficient of the passive layer 13 and the difference between the first and second thermal expansion coefficient is large, so the deformation of the active layer 11 is significantly greater than that of the passive layer 13 due to thermal expansion and results the bending of the backplane 1 toward the passive layer 13.

When the power is not turned on, the backplane 1 shown in the dash line of FIG. 2 is in planar status. Assuming the temperature of the backplane is T1, the thickness of the backplane is S, the backplane 1 is placed at two pivots with a distance L, and the backplane 1 is heated and bends as turning on the power. Assuming the temperature is increased to T2, then the corresponding curvature radius of backplane is r, the central deflections is A, the specific thermal deflection is K, and the temperature rate is F, there are:

$$A=K(T2-T1)L^2/S$$

$$F=8AS/(L^2+4A^2+4AS)*(T2-T1)$$

$$r=S(T2-T1)/F$$

The specific thermal deflection between the materials in the backplane 1 is a rigid value. A can be calculated once T1 and T2 are confirmed, F can be obtained by further calculation, and the curvature radius r of the backplane can be calculated finally. The curvature of the backplane can be obtained via controlling the temperature of the backplane 1.

The function of temperature sensor 5 is to detect and display the real-time temperature of the backplane, and transmit the temperature data to the temperature controller 7. To obtain a different curvature of the backplane, various value can be preset through the temperature controller 7, as the temperature of the backplane 1 is lower than the preset temperature value, the temperature controller 7 turns on the current and voltage and heating continues until the temperature reaches a preset value; when the temperature reaches or exceeds a preset temperature value, the temperature controller 7 turn off current and voltage, and prevent the temperature continues to rise. Thus, the curvature of the backplane can be quickly and continuously adjusted by regulating the temperature of the backplane 1 via the temperature controller 7.

Figure 4:
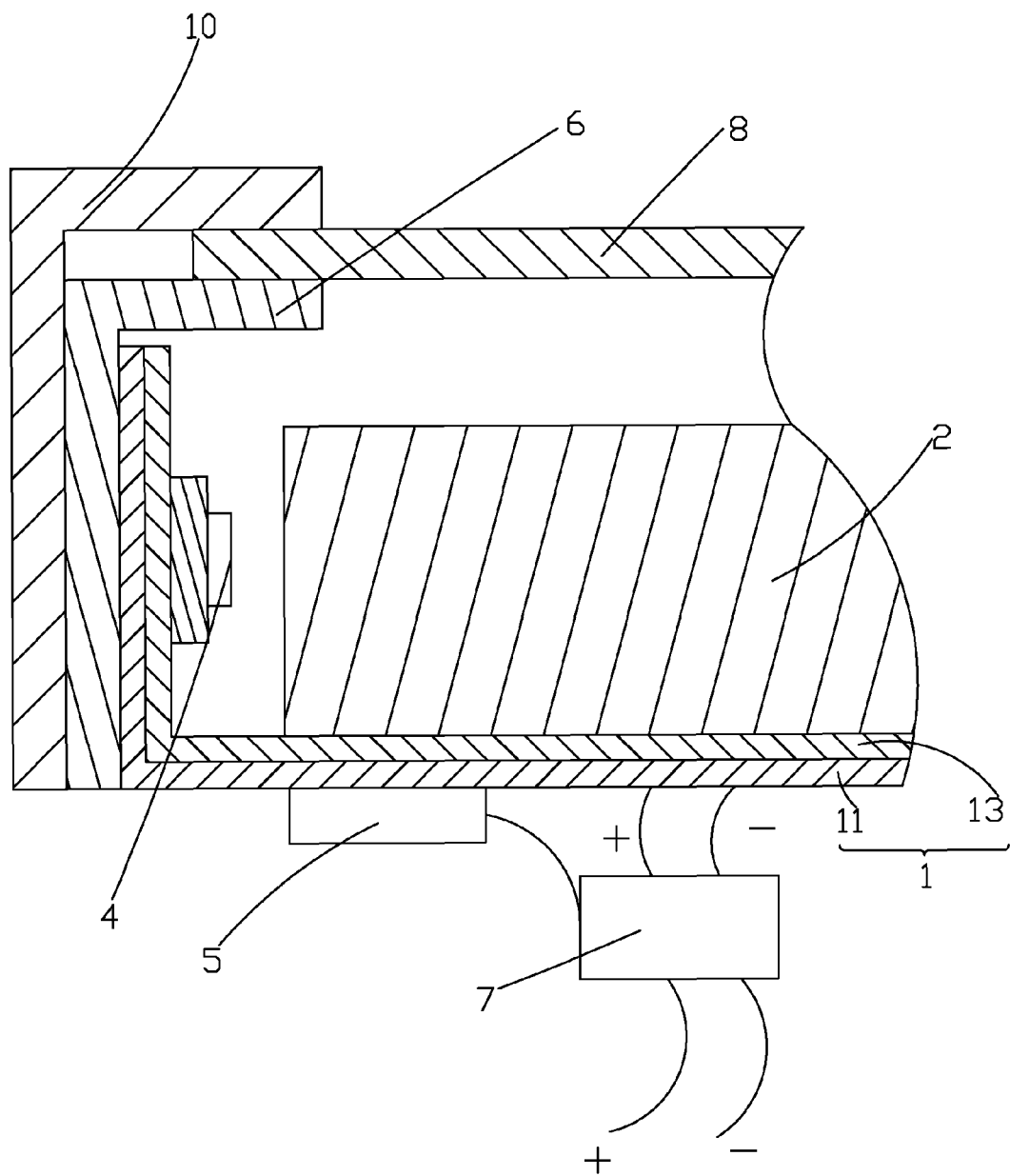
FIG. 4 is schematic view of the backplane with adjustable curvature applied to the liquid crystal display.

Refer to FIG. 4, a schematic view shows that the backplane of the present invention with the adjustable curvature is applied to a liquid crystal display apparatus. The liquid crystal display device comprises the backplane 1 with the adjustable curvature, an optical assembly in the backplane 2, a backlight provided inside of the backplane 4, a plastic frame 6 mounted on the backplane 1, a LCD panel 8 placed on the plastic frame 6, and the LCD panel 8 fixed at plastic frame 6 on the front frame 10. When the power is not turned on, the backplane 1 is not deformed and in planar status, the liquid crystal display device can be used as a flat liquid crystal display device. As turning on the power, the backplane bends, and the temperature sensor 5 can detect and display the temperature of the backplane 1. The temperature controller 7 can regulate the temperature of the backplane 1, so different curvatures of the backplane 1 will be available. The deformations of other components of the LCD are accommodated with the bending of the backplane 1 to achieve a convenient, fast and continuously adjustment to whole liquid crystal display apparatus.

Figure 5:
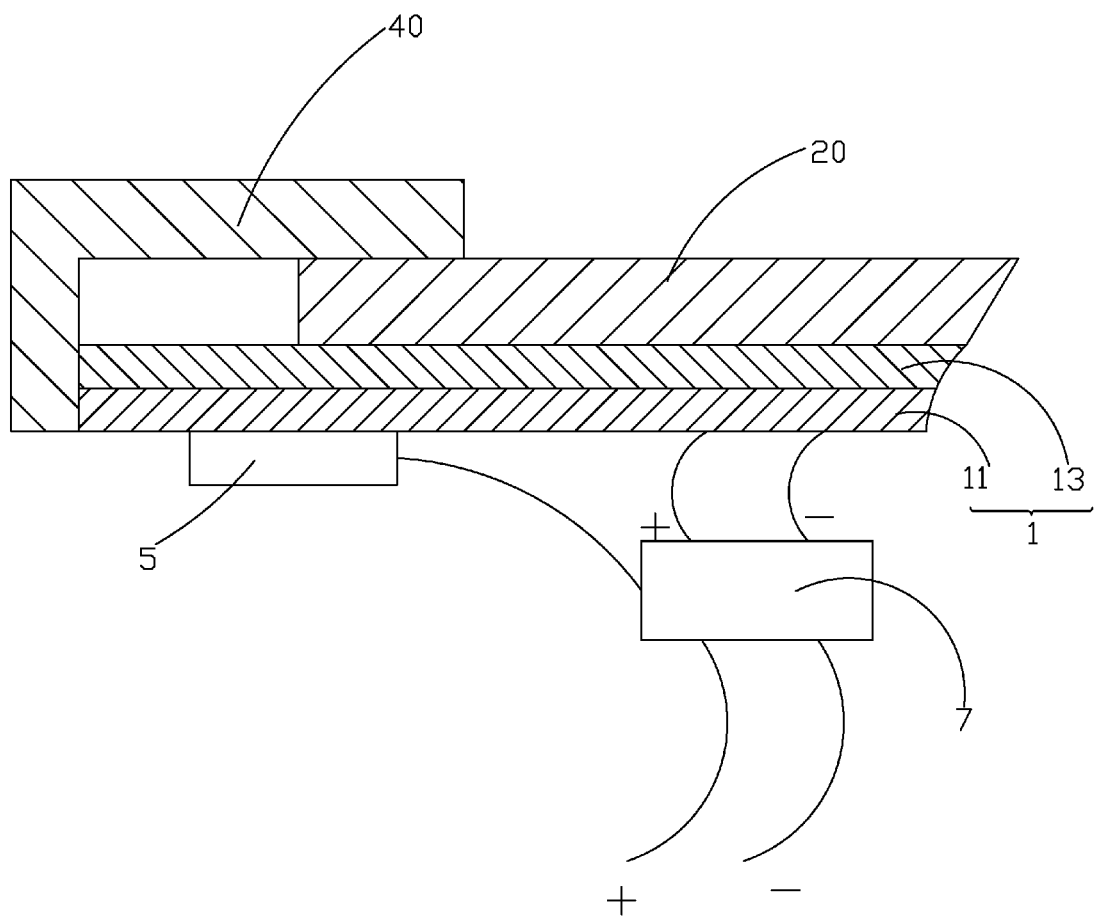
FIG. 5 is schematic view of the backplane with adjustable curvature applied to the organic light emitting diode display.

Refer to FIG. 5, the schematic view shows the backplane of the present invention with the adjustable curvature is applied to an organic light emitting diode display device. The organic light emitting diode display device comprises a backplane 1 with the adjustable curvature, a display panel 20 on the backplane and the front frame 40 fixing the display panel. When the power is not turned on, the backplane 1 does not deform and is in planar status, the organic light emitting diode display device can be used as a flat display device. As turning on the power, the backplane bends and the temperature sensor 5 can detect and display the temperature of the backplane 1. The temperature controller 7 can regulate the temperature of the backplane 1, so different curvatures of the backplane 1 will be available. The deformations of other components of organic light emitting device display are accommodated with the bending of the backplane 1 to achieve a convenient, fast and continuously adjustment to whole organic light emitting display apparatus.

In summary, the present invention discloses the backplane with the adjustable curvature. The first thermal expansion coefficient of the material of the active layer is greater than the second thermal expansion coefficient of the material of the passive layer. As the backplane is heated electronically, the deformation of the active layer is larger than that of the passive layer due to thermal expansion, so the backplane is bent toward the side of the passive layer. Meanwhile, the temperature of the backplane can be detected and displayed via the temperature sensor, then it can be controlled via the temperature controller. Therefore, the curvature of the backplane can be fast and continuously adjusted by controlling the temperature of the backplane. The backplane with the adjustable curvature can be used in a liquid crystal display device or an organic light emitting diode display device by adjusting the curvature of the backplane to easily, quickly, continuously adjust the curvature of the display device. Users can attain different display status based on different needs in watching so as to promote the attractiveness to the market, and the structure of the invention is relatively simple and easy to be implemented.

All of stated in above, for the people with ordinary skill in the art, it can be transformed to various other changes and modifications according to the corresponding aspect of the present invention and the technical idea, and all such changes and modifications shall be belong to the scope of the claims of the invention.

What is claimed is:

1. A backplane with adjustable curvature, comprising an active layer and a passive layer connected to the active layer, wherein the active layer is made of a material with a first thermal expansion coefficient, the passive layer is made of a material with a second thermal expansion coefficient, the first thermal expansion coefficient is greater than the second thermal expansion coefficient, and the backplane is bendable toward a side of the backplane where the passive layer is located by heating;

wherein the backplane further comprises a temperature sensor and a temperature controller; the temperature sensor is attached onto the backplane to detect a real-time temperature of the backplane and electrically connected to the temperature controller to provide the real-time temperature to the temperature controller, the temperature controller is electrically connected to the backplane to control on-off state and magnitude of voltage and current applied to the active layer and the passive layer for heating from a power supply so as to regulate a temperature of the backplane and thereby adjust a curvature of the backplane.

2. The backplane of claim 1, wherein the first thermal expansion coefficient is in a range of $20\times10^{-6}$-$27\times10^{-6}$ m/° C. in 20-100° C., and the second thermal expansion coefficient is in a range of $1.8\times10^{-6}$-$4.8\times10^{-6}$ m/° C. in 20-100° C.

3. The backplane of claim 1, wherein the specific thermal deflection between the material with the first thermal expansion coefficient and the material with the second thermal expansion coefficient is in a range of $10\times10^{-6}$-$20\times10^{-6}$ $K^{-1}$.

4. The backplane of claim 1, wherein the resistivity of the material of the active layer and the resistivity of the material of the passive layer are in a range of $2\times10^{-6}$-$11\times10^{-6}$ $\Omega\cdot m$.

5. The backplane of claim 1, wherein the active layer and the passive layer are formed by metal materials.

6. The backplane of claim 5, wherein the active layer and the passive layer are formed by a thermal bimetal, the material of the active layer is brass, nickel, or an alloy of Fe—Ni—Cr, Fe—Ni—Mn or Mn—Ni—Cu, and the material of the passive layer is an Invar alloy containing 34%-50% Ni.

7. An application of the backplane with the adjustable curvature of claim 1, applied to a liquid crystal display device or an organic light emitting diode display device; wherein a curvature of the liquid crystal display device or the organic light emitting diode display device is adjustable by heating the active layer and the passive layer of the backplane to provide a curved display.

8. A backplane with adjustable curvature, comprising an active layer and a passive layer connected to the active layer, wherein the active layer is made of a material with a first thermal expansion coefficient, the passive layer is made of a material with a second thermal expansion coefficient, the first thermal expansion coefficient is greater than the second thermal expansion coefficient, and the backplane is bendable toward a side of the backplane where the passive layer is located by heating;

wherein the first thermal expansion coefficient is in a range of $20\times10^{-6}$-$27\times10^{-6}$ m/° C. in 20-100° C., and the second thermal expansion coefficient is in a range of $1.8\times10^{-6}$-$4.8\times10^{-6}$ m/° C. in 20-100° C., wherein the specific thermal deflection between the material with the first thermal expansion coefficient and the material with the second thermal expansion coefficient is in a range of $10\times10^{-6}$-$20\times10^{-6}$ $K^{-1}$, wherein the resistivity of the material of the active layer and the resistivity of the material of the passive layer are in a range of $2\times10^{-6}$-$11\times10^{-6}$ $\Omega\cdot m$, wherein the active layer and the passive layer are formed by metal materials, wherein the active layer and the passive layer are formed by a thermal bimetal, the material of the active layer is brass, nickel, or an alloy of Fe—Ni—Cr, Fe—Ni—Mn or Mn—Ni—Cu, and the material of the passive layer is an Invar alloy containing 34%-50% Ni;

wherein the backplane further comprises a temperature sensor and a temperature controller; the temperature sensor is attached onto the backplane to detect a real-time temperature of the backplane and electrically connected to the temperature controller to provide the real-time temperature to the temperature controller, the temperature controller is electrically connected to the backplane to control on-off state and magnitude of voltage and current applied to the active layer and the passive layer for heating from a power supply so as to regulate a temperature of the backplane and thereby adjust a curvature of the backplane.

\* \* \* \* \*